United States Patent
Hsu et al.

(10) Patent No.: US 7,817,487 B2
(45) Date of Patent: *Oct. 19, 2010

(54) MOTHERBOARD WITH VOLTAGE REGULATOR FOR SUPPORTING DDR2 MEMORY MODULES AND DDR3 MEMORY MODULES

(75) Inventors: Shou-Kuo Hsu, Taipei Hsien (TW); Duen-Yi Ho, Taipei Hsien (TW); Cheng-Shien Li, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 286 days.

This patent is subject to a terminal disclaimer.

(21) Appl. No.: 11/952,140

(22) Filed: Dec. 7, 2007

(65) Prior Publication Data

US 2009/0086561 A1    Apr. 2, 2009

(30) Foreign Application Priority Data

Sep. 27, 2007    (CN) .................. 2007 1 0201879

(51) Int. Cl.
*G11C 5/14*    (2006.01)
(52) U.S. Cl. .................. 365/226; 365/51; 365/149; 365/233.13; 710/10
(58) Field of Classification Search ............ 365/51, 365/149, 226, 233.13; 710/10
See application file for complete search history.

(56) References Cited

U.S. PATENT DOCUMENTS

| | | | | |
|---|---|---|---|---|
| 6,298,426 | B1 * | 10/2001 | Ajanovic .................. | 711/172 |
| 6,424,555 | B1 * | 7/2002 | Chang .................. | 365/63 |
| 6,498,759 | B2 * | 12/2002 | Chang et al. .................. | 365/226 |
| 6,516,381 | B1 * | 2/2003 | Hamilton et al. .................. | 711/105 |
| 6,681,286 | B2 * | 1/2004 | Chang et al. .................. | 710/316 |
| 6,742,067 | B2 * | 5/2004 | Hsien .................. | 710/301 |
| 6,828,822 | B1 * | 12/2004 | Bellis et al. .................. | 326/38 |
| 7,327,612 | B2 * | 2/2008 | Bacchus et al. .................. | 365/189.011 |
| 7,545,700 | B2 * | 6/2009 | Chen et al. .................. | 365/226 |
| 2008/0225499 | A1 * | 9/2008 | Meng et al. .................. | 361/767 |

* cited by examiner

*Primary Examiner*—VanThu Nguyen
*Assistant Examiner*—Alexander Sofocleous
(74) *Attorney, Agent, or Firm*—Frank R. Niranjan

(57) ABSTRACT

An exemplary motherboard includes a driving module, a first slot module arranged for mounting a first type of memory and connected to the driving module via a first channel, a second slot module arranged for mounting a second type of memory and connected to the driving module via a second channel, and a voltage regulator electronically connected to the first slot module and the second slot module. The first memory and the second memory are alternatively mounted on the motherboard, the voltage regulator detects which type memory is currently mounted on the motherboard and outputs voltages suitable for the type of the memory mounted on the motherboard accordingly.

7 Claims, 3 Drawing Sheets

MOTHERBOARD WITH VOLTAGE REGULATOR FOR SUPPORTING DDR2 MEMORY MODULES AND DDR3 MEMORY MODULES

CROSS-REFERENCES TO RELATED APPLICATION

Relevant subject matter is disclosed in a co-pending U.S. patent application with application Ser. No. 11/952,139 filed on the same date and having a same title, and a co-pending U.S. patent application with application Ser. No. 11/766,105, filed on Jun. 21, 2007, and entitled "MOTHERBOARD", which are assigned to the same assignee as this patent application.

BACKGROUND

1. Field of the Invention

The present invention relates to motherboards, and particularly to a motherboard for supporting different types of memories.

2. Description of Related Art

Currently, a typical personal computer comprises a motherboard, interface cards, and peripheral accessories. The motherboard is the heart of the personal computer. On the motherboard, in addition to the central processing unit (CPU), the chip set, and the slots for installing the interface cards, it further includes memory module slots for installing memory modules.

Due to constant change in the computer industry, memories used in the computer have changed from DDR2 (Double Data Ram II) used in the past to higher speed memories such as DDR3 (Double Data Ram III).

Because DDR2 is cheaper than DDR3, the main board with DDR2 still is in demand in the market. The difference in operating DDR2 and DDR3 includes: DDR2 utilizes 1.8V VDD and 0.9V VTT, while DDR3 utilizes 1.5V VDD and 0.75V VTT. Currently, no motherboard is compatible with both DDR3 and DDR2. As a result, more motherboards have to be fabricated adding to production cost.

What is needed is to provide a motherboard capable of flexibly supporting different types of memories.

SUMMARY

An exemplary motherboard includes a driving module, a first slot module arranged for mounting a first type of memory and connected to the driving module via a first channel, a second slot module arranged for mounting a second type of memory and connected to the driving module via a second channel, and a voltage regulator electronically connected to the first slot module and the second slot module. The first memory and the second memory are alternatively mounted on the motherboard, the voltage regulator detects which type memory is currently mounted on the motherboard and outputs voltages suitable for the type of memory mounted on the motherboard accordingly.

Other advantages and novel features of the present invention will become more apparent from the following detailed description of preferred embodiment when taken in conjunction with the accompanying drawings, in which:

DETAILED DESCRIPTION

Figure 1:
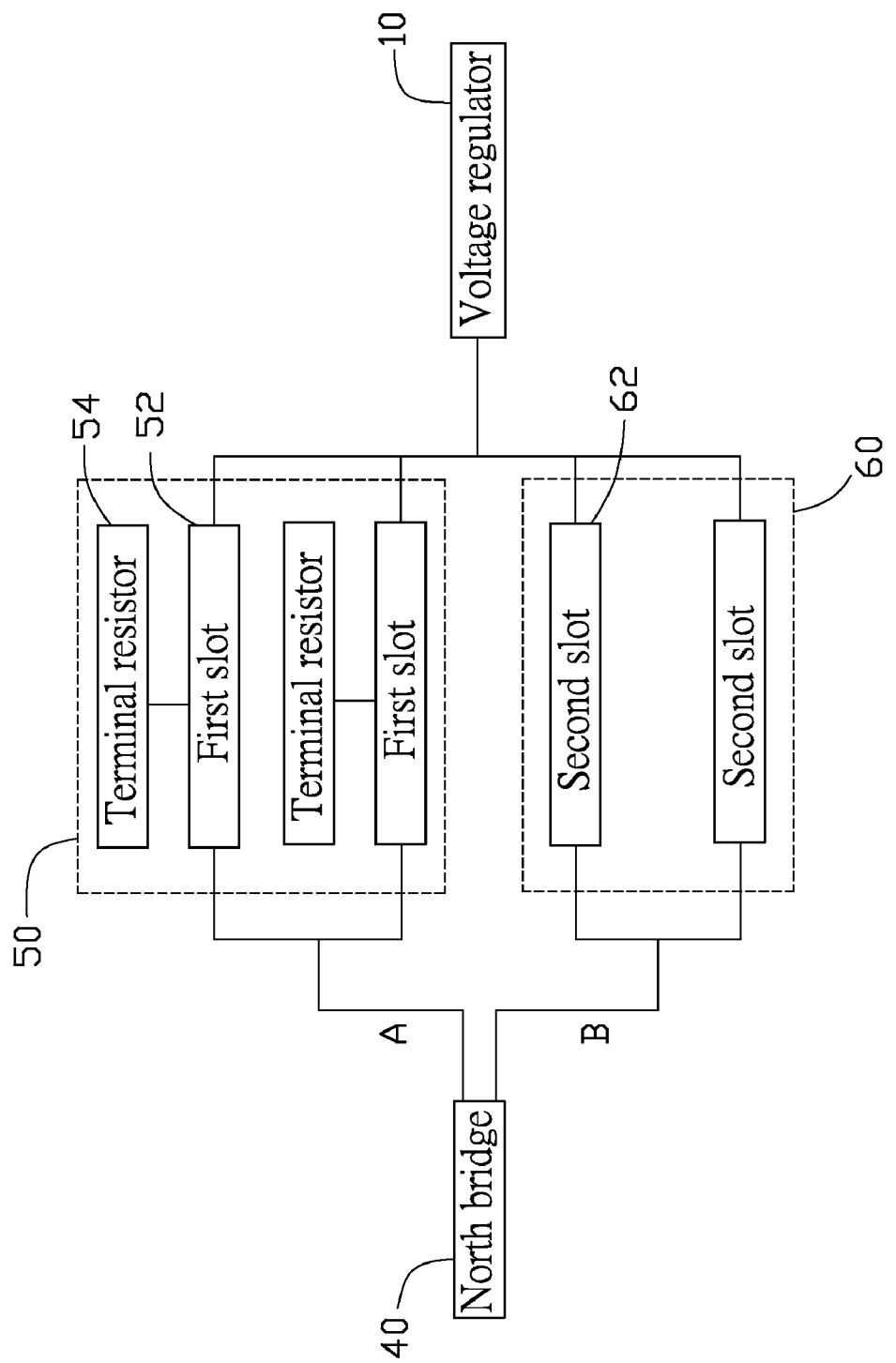
FIG. 1 is an isometric view of a motherboard for supporting different types of memories in accordance with the present invention having a slot and a voltage regulator.

Referring to FIG. 1, a motherboard for supporting different types of memories in accordance with an embodiment of the present invention includes a voltage regulator 10, a driving module 40 such as a north bridge chipset, a first slot module 50 connected to the driving module 40 via a channel A, and a second slot module 60 connected to the driving module 40 via a channel B. The first slot module 50 includes two first slots 52, each of which is connected to a terminal resistor 54. The second slot module 60 includes two second slots 62. The first slots 52 are used for installing two first memories, such as two DDR2 memories. The second slots 62 are used for installing two second memories, such as two DDR3 memories. Each of the first slots 52 includes a ground terminal to generate a ground signal when the first memories are mounted in the first slots 52. Each of the second slots 62 includes a ground terminal to generate a ground signal when the second memories are mounted in the second slots 62. The first memory and the second memory are alternatively mounted on the motherboard. What follows is an example with just one first slot 52 and one second slot 62 mounted on the motherboard.

Figure 2:
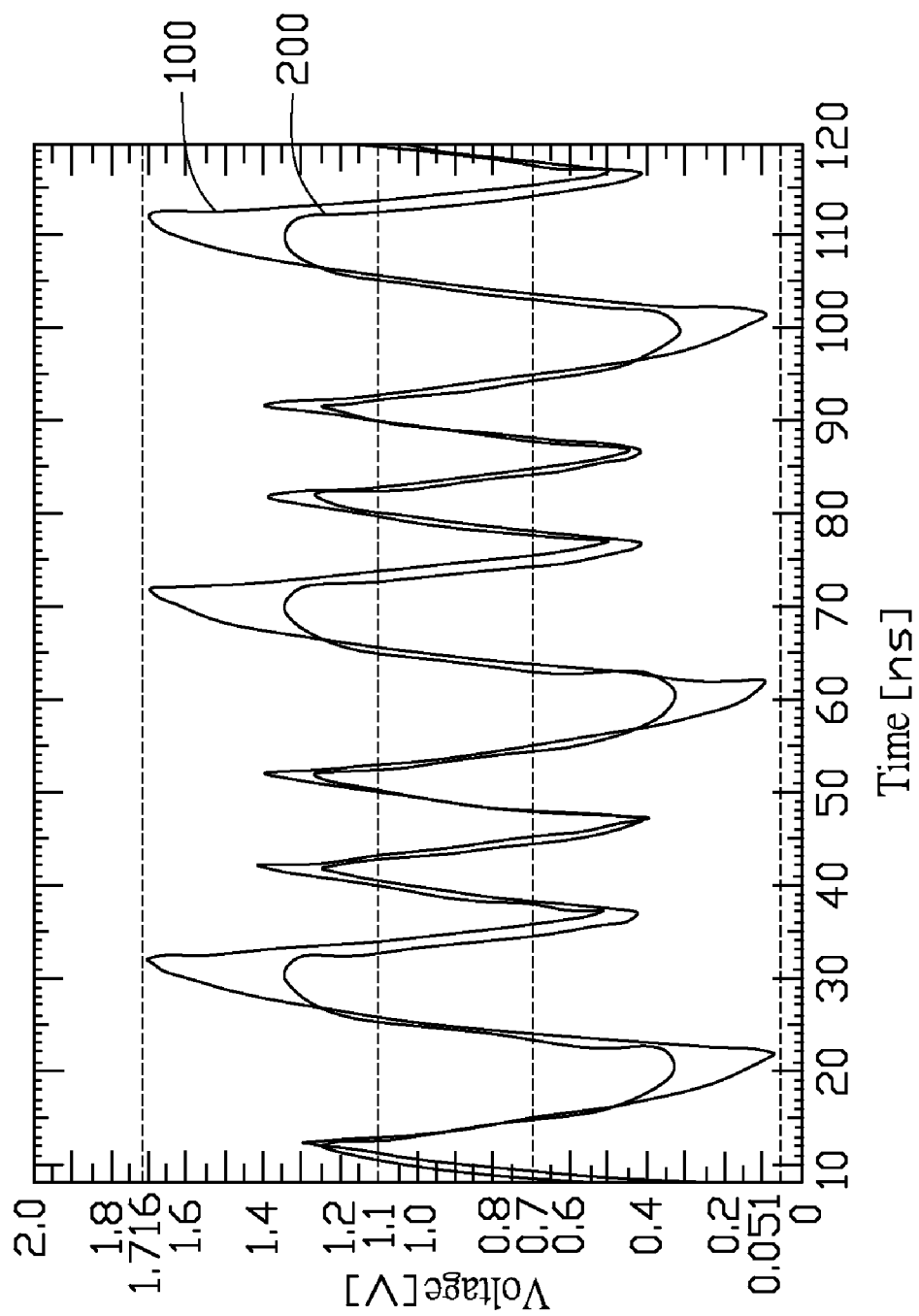
FIG. 2 is graph comparing waveforms received by the slot of FIG. 1.

Referring to FIG. 2, curve 100 is a voltage waveform obtained at the first slot 52 when the first slot 52 is connected to the terminal resistor 54. Curve 200 is a voltage waveform obtained at the first slot 52 when the terminal resistor 54 is removed. Comparing the curve 100 with the curve 200, it can be seen that the terminal resistor 54 eliminates echo signals generated by the first type memory mounted in the first slot 52, but both the curve 100 and the curve 200 are in accord with a standard of JEDEC (Joint Electron Device Engineering Council). Therefore, a designer can remove the terminal resistor 54 to reduce cost.

Figure 3:
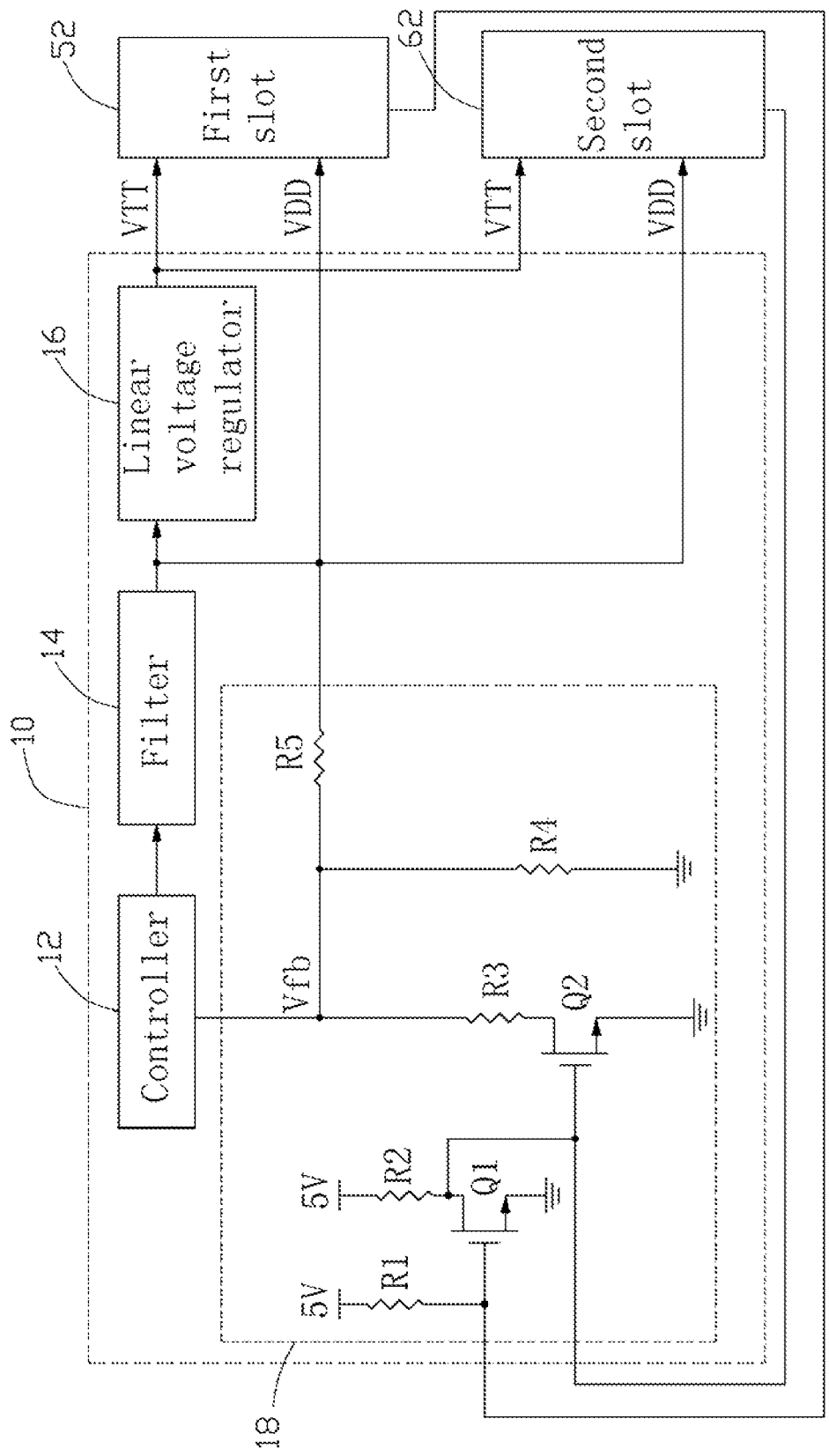
FIG. 3 is a circuit diagram of the voltage regulator of FIG. 1.

Referring to FIG. 3, the voltage regulating circuit 10 comprises a controller 12 having a feedback terminal and an output terminal, a filter 14 having an input terminal and an output terminal, a linear voltage regulator 16, and a feedback circuit 18. The output of the controller 12 is connected to the input terminal of the filter 14, and the filter 14 outputs a VDD voltage at the output terminal thereof. The VDD voltage is transmitted to the linear voltage regulator 16, and is converted into a VTT voltage transmitted to the first slot 52 and the second slot 62. The output terminal of the filter 14 is connected to the first slot 52 and the second slot 62 to provide the VDD voltage.

The feedback circuit 18 comprises two transistors Q1 and Q2, four resistors R1~R4, and a feedback resistor R5. The transistors Q1 and Q2 are PMOS transistors. The gate of the transistor Q1 is connected to the ground terminal of the first slots 52 and to a 5V power source via the resister R1. The source of the transistor Q1 is grounded. The drain of the transistor Q1 is connected to the 5V power source via the resistor Q2 and to the gate of the transistor Q2. The gate of the transistor Q2 is connected to the ground terminal of the second slots 30. The source of the transistor Q2 is grounded. The drain of the transistor Q2 is grounded via the resistors R3 and R4 in turn and also connected to the feedback terminal of the controller 12 via the resistor R3. The feed back resistor R5 is connected between the output terminal of the filter 14 and the feedback terminal of the controller 12. The resistances of the resistors Q1~Q4 are approximately 4.7 Kohms, 4.7 Kohms, 2.4 Kohms, and 1.2 Kohms respectively, and the resistance of the feedback resistor R5 is approximately 1.1 Kohms. The operation of the feedback circuit 18 is premised upon the fact that the level of the feedback voltage Vfb is stable, in this preferred embodiment, the level of the feedback voltage Vfb is 0.78V.

When the DDR2 memory is mounted in the first slot 52, the second slot 62 is idle. The ground terminal of the first slot 52 generates a ground signal. The transistor Q1 is turned on, and the transistor Q2 is turned off. According to the following formula: VDD=Vfb*(R5+R4)/R4, the voltage output from the controller 12 is 1.8V. The voltage is provided to the filter 14, which filters and rectifies the voltage to provide a smooth voltage output. The VDD is provided to the feedback circuit 18 and the DDR2 memory mounted in the first slot 52. The linear voltage regulator 16 is configured to receive the VDD voltage and provide a regulated output voltage of VTT (0.9V), which is provided to the DDR2 memory.

When the DDR3 memory is mounted in the second slot 62, the first slot 52 is idle. The ground terminal of the second slot 62 generates the ground signal. The transistor Q1 is turned off, the transistor Q2 is turned on, and the resistor R3 is connected in the circuit. According to the following formula: VDD=Vfb*(R5+Rx)/Rx, wherein Rx=(R3+R4)/R3*R4, the voltage output from the controller 12 is 1.5V. The voltage is provided to the filter 14, which filters and rectifies the voltage to provide a smooth voltage output. The VDD is provided to the feedback circuit 18 and the DDR3 memory mounted in the second slot 62. The linear voltage regulator 16 is configured to receive the VDD voltage and provide a regulated output voltage of VTT (0.75V), which is provided to the DDR3 memory.

Thus, the motherboard is capable of utilizing either the DDR2 or the DDR3, thus enhancing production capability and reducing production cost.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A motherboard for supporting different types of memories, comprising:
    a driving module;
    a first slot module arranged for mounting a first type of memory and connected to the driving module via a first channel, the first slot module comprising at least one first slot having a ground terminal for generating a ground signal when the first type of memory mounted therein;
    a second slot module arranged for mounting a second type of memory and connected to the driving module via a second channel, the second slot module comprising at least one second slot having a ground terminal for generating a ground signal when the second type of memory mounted therein, wherein the first memory and the second memory are alternatively mounted on the motherboard; and
    a voltage regulator electronically connected to the first slot and the second slot to detect which type of memory is mounted on the motherboard by receiving the ground signal generated by the slots, and output voltages suitable for the detected type of memory mounted on the motherboard, the voltage regulator comprising;
    a feedback circuit receiving the ground signal from the ground terminal of the first slot or the second slot and outputting a constant feedback voltage according to the ground signal;
    a controller comprising a feedback terminal to receive the constant feedback voltage and convert the constant feedback voltage to a first voltage, and an output terminal to output the first voltage to the first slot or the second slot; and
    a linear voltage regulator comprising an input terminal to receive the first voltage from the output terminal of the controller and convert the first voltage to a second voltage, and an output terminal to output the second voltage to the first slot or the second slot.

2. The motherboard as claimed in claim 1, wherein the voltage regulator comprises:
    a filter comprising an input terminal connected to the output terminal of the controller to receive the first voltage from the controller, and an output terminal connected to the first slot and the second slot to provide the first voltage to the first slot and the second slot via filtering, a feedback resistor is connected between the output terminal of the filter and the feedback terminal of the controller; and
    the feedback circuit comprising a first transistor and a second transistor, the gate of the first transistor connected to the ground terminal of the first slot and to a power source via a first resistor, the source of the first transistor grounded, the drain of the first transistor connected to the power source via a second resistor and to the gate of the second transistor, the gate of the second transistor also connected to the ground terminal of the second slot, the source of the second slot grounded, the drain of the second transistor grounded via a third resistor and a fourth resistor in turn and also connected to the feedback terminal of the controller via the third resistor.

3. The motherboard as claimed in claim 2, wherein the first transistor and the second transistor are PMOS transistors.

4. The motherboard as claimed in claim 2, wherein the resistances of the first to the fourth resistors are approximately 4.7 Kohms, 4.7 Kohms, 2.4 Kohms, and 1.2 Kohms respectively, and the resistance of the feedback resistor is approximately 1.1 Kohms.

5. The motherboard as claimed in claim 2, wherein a feedback voltage at the feedback terminal of the controller is 0.78V.

6. The motherboard as claimed in claim 2, wherein the first slot is a DDR2 slot, and the second slot is a DDR3 slot.

7. The motherboard as claimed in claim 6, wherein the first slot is further connected to a terminal resistor.

* * * * *